United States Patent
Gullette

(10) Patent No.: US 8,726,217 B2
(45) Date of Patent: May 13, 2014

(54) METHODS FOR ANALYZING CELLS OF A CELL LIBRARY

(75) Inventor: James B. Gullette, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 211 days.

(21) Appl. No.: 13/010,391

(22) Filed: Jan. 20, 2011

(65) Prior Publication Data
US 2012/0192135 A1    Jul. 26, 2012

(51) Int. Cl.
*G06F 17/50*    (2006.01)
(52) U.S. Cl.
USPC .......................... 716/126; 716/136; 716/139
(58) Field of Classification Search
USPC .......................... 716/132, 136, 139
See application file for complete search history.

(56) References Cited

U.S. PATENT DOCUMENTS

| | | | |
|---|---|---|---|
| 7,178,123 B2 * | 2/2007 | Lin et al. | 716/102 |
| 7,503,021 B2 * | 3/2009 | Boucher et al. | 716/136 |
| 7,627,838 B2 * | 12/2009 | Keswick | 716/132 |

OTHER PUBLICATIONS

Office Action mailed Mar. 15, 2013 in Korean Patent Application No. 10-2011-0112969.

* cited by examiner

*Primary Examiner* — Thuan Do
(74) *Attorney, Agent, or Firm* — Ingrassia Fisher & Lorenz, P.C.

(57) ABSTRACT

Methods and systems are provided for analyzing cells of a cell library used to generate a layout. One exemplary method involves determining a routed connection location utilized in the layout for a pin of the cell for each instance of the cell in the layout. The method continues by determining a utilization metric for the pin of the cell based on the plurality of routed connection locations and a plurality of possible connection locations for the pin, and displaying the utilization metric on a display device.

20 Claims, 4 Drawing Sheets

METHODS FOR ANALYZING CELLS OF A CELL LIBRARY

TECHNICAL FIELD

Embodiments of the subject matter generally relate to semiconductor device structures and related design and fabrication methods, and more particularly, embodiments of the subject matter relate to methods for analyzing cells of a cell library after being placed and routed in a layout.

BACKGROUND

Modern electronic circuits are often designed and subsequently manufactured using software tools, commonly referred to as electronic design automation (EDA) tools. Typically, a circuit designer will utilize a software design tool or hardware description language to describe the intended functionality of the circuit. The high-level functional description is provided to a synthesis tool that converts the intended functionality to a netlist, which represents the instances of logic gates and/or other hardware components and their corresponding interconnections that, when configured, will provide the intended functionality. A software placement tool places instances of the logic gates and/or hardware components of the netlist in an optimal manner. Often, the placement tool obtains and places instances of the logic gates and/or hardware components using a standard cell library, which includes a number possible logic gates and/or hardware components that may be used to implement the netlist in the particular technology configured as cells that are standardized to have a fixed dimension. After placement, a software routing tool (or router) optimally creates interconnections between the placed cells based on the netlist taking into account design rules for the particular technology, resulting in a completed layout for the circuit. A completed layout for a circuit or device may be encoded in a suitable file format, such as Graphical Database System II (or GDSII) format, on a computer-readable medium that may be subsequently provided to a foundry or mask shop to translate the completed layout into photomasks that may then be used to fabricate the circuit.

Often, standard cells of the standard cell library are designed to provide, for each input/output pin (or terminal) of the cell, a sufficient number of possible locations (or a sufficiently large area) that may be used to form connections to the pins and facilitate routing to/from placed instances of the cell by the routing tool without violating design rules. However, the ability of the routing tool to route to/from each placed cell will vary depending on the placement of that cell within the layout, its neighboring cells, and the design rules for the technology, along with other factors. Thus, it is difficult or otherwise impractical to exhaustively test the ability of the routing tool to route to/from and/or connect to each pin of each standard cell in the standard cell library. As a result, it is difficult to identify issues pertaining to routability and/or connectivity until the standard cell library is being utilized by the placement tool and/or routing tool outside of the testing environment to design new circuits, at which point, it can be difficult to debug and identify what the routability and/or connectivity issue is attributable to.

BRIEF SUMMARY

A method is provided for analyzing a cell of a cell library used to generate a layout. The method involves the steps of determining, for each instance of the cell in the layout, a respective routed connection location utilized in the layout for a pin of the cell, and determining a utilization metric for the pin of the cell based on the plurality of routed connection locations and a plurality of possible connection locations for the pin. The method continues by displaying the utilization metric on a display device.

In another embodiment, a method for analyzing a cell of a cell library used to obtain a layout involves identifying each instance of the cell placed in the layout and identifying, for each placed cell, a routed connection location utilized by the layout to connect to a first terminal of the cell, resulting in a plurality of routed connection locations. The method continues by determining, for each possible connection location of a plurality of possible connection locations for the first terminal of the cell, a number of times that respective possible connection location is utilized in the layout based on a number of routed connection locations of the plurality of routed connection locations that correspond to that respective possible connection location, determining a utilization metric for the cell based on the number of times that each respective possible connection location is utilized in the layout, and displaying the utilization metric on a display device.

In yet another embodiment, an apparatus for a computer-readable medium having computer-executable instructions or data stored thereon executable by a computing device is provided. When executed by the computing device, the computer-executable instructions are configured to obtain a layout representative of a netlist, identify each instance of a first cell of a cell library utilized by the layout to implement the netlist that is placed in the layout, determine a utilization metric for the first cell based on routed connection locations for a pin of the first cell utilized in the layout for the identified instances of the first cell, and display a graphical representation of the utilization metric on a display device that is communicatively coupled to the computing device.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to analyze the utilization of the input/output terminals (alternatively referred to herein as pins) of one or more standard cells in a standard cell library by a software routing tool. In this regard, a user may analyze utilization metrics for the input/output pins of a standard cell to ascertain whether any problems exist with the design of the connection areas for the input/output pins that may result in subsequent failures to be routed to/from by the software routing tool in future circuit designs. The usage of using electronic design automation (EDA) tools and the various steps in the electronic design flow are well known and so, in the interest of brevity, many conventional steps or other implementation aspects will only be mentioned briefly herein or will be omitted entirely without providing the well known details.

Figure 1:
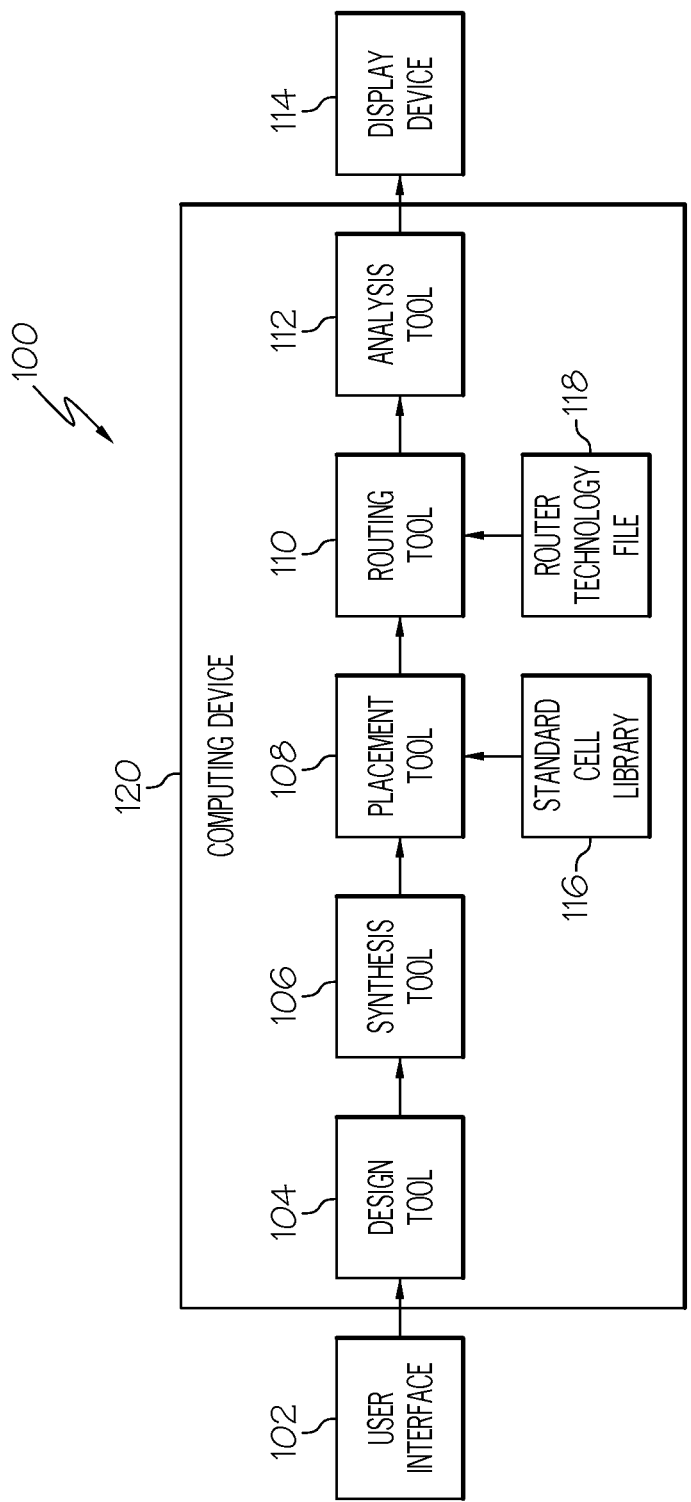
FIG. 1 is a block diagram of an electronic device design system in an exemplary embodiment.

FIG. 1 depicts an exemplary embodiment of an electronic device design system 100 suitable for analyzing pin accessibility, that is, the ability to access and/or connect to individual input/output pins, of standard cells in a standard cell library as described in greater detail below in the context of FIGS. 2-7. The illustrated embodiment of electronic device design system 100 includes, without limitation, a user interface 102, a design tool 104, a synthesis tool 106, a placement tool 108, a routing tool 110, an analysis tool 112, a display device 114, a standard cell library 116, and a router technology file 118. In an exemplary embodiment, the design tool 104, the synthesis tool 106, the placement tool 108, the routing tool 110, and the analysis tool 112 are each realized as a software module (or EDA tool) executed or otherwise implemented by a computing device 120 (e.g., a computer, a processor, or the like) to perform their respective tasks, functions, and/or operations described herein. In this regard, the functionality of the design tool 104, the synthesis tool 106, the placement tool 108, the routing tool 110, and/or the analysis tool 112 can be stored on, encoded on, or otherwise embodied by any suitable non-transitory computer readable medium (e.g., a removable disk, a CD-ROM, a digital versatile disk (DVD), flash memory, a hard disk, registers, RAM memory, ROM memory, a magnetic storage device, etc.) as computer-executable instructions or data stored thereon that, when executed by the computing device 120, perform the tasks, functions, and/or operations described herein. It should be noted that although FIG. 1 depicts the design tool 104, the synthesis tool 106, the placement tool 108, the routing tool 110, and the analysis tool 112 as separate elements, in some embodiments, the design tool 104, the synthesis tool 106, the placement tool 108, the routing tool 110, and the analysis tool 112 may be integrated into a single software module executable by the computing device 120.

The user interface 102 is coupled to the computing device 120 and generally represents the physical component of the electronic device design system 100 configured to allow a user, such as a circuit designer, to interact with the design tool 104 and/or other elements of the electronic device design system 100 in a conventional manner. Depending on the embodiment, the user interface 102 may be realized as a keyboard, mouse, touchpad, touch panel (or touchscreen), or another suitable device adapted to receive input from a user. The computing device 120 generally represents the hardware and/or firmware components configured to implement or otherwise execute the design tool 104, the synthesis tool 106, the placement tool 108, the routing tool 110, and the analysis tool 112 to support operation of the electronic device design system 100 as described in greater detail below. The computing device 120 may be implemented or realized with a processor or other processing logic configured to carry out the functions, techniques, and processing tasks described herein. In an exemplary embodiment, the display device 114 is realized as an electronic display that is communicatively coupled to the computing device 120 and configured to graphically display pin utilization metrics or other pin connectivity information under control of the analysis tool 112 and/or computing device 120.

In an exemplary embodiment, the design tool 104 generally represents the software module executed or otherwise implemented by the computing device 120 that is configured to support high-level functional circuit design, for example, by supporting a suitable hardware description language (e.g., Verilog, VHDL, or the like). A user (e.g., a circuit designer) utilizes or otherwise operates the user interface 102 to interact with the design tool 104 to describe or otherwise define the intended functionality of a circuit to be created. The synthesis tool 106 generally represents the software module executed or otherwise implemented by the computing device 120 that is configured to interact with the design tool 104 and convert the intended high-level functionality provided to the design tool 104 by a user into a design netlist that describes the instances of logic gates and/or other hardware components (e.g., the types of logic gates and/or components and the numbers thereof) along with the corresponding interconnections needed to implement the intended functionality.

The placement tool 108 generally represents the software module executed or otherwise implemented by the computing device 120 that is configured to receive the design netlist from the synthesis tool 106, select standard cells from the standard cell library 116 needed to implement the logic gates and/or hardware components specified by the design netlist, and optimally place the selected standard cells. In this regard, the standard cell library 116 generally represents a collection of standardized cells, wherein each cell of the standard cell library 116 represents a logic gate or hardware component capable of being implemented in the particular fabrication technology (or technology node), and each cell has the same (or standard) dimension as the other cells of the standard cell library 116. For example, each standard cell in the standard cell library 116 may have the same cell height that corresponds to the number of horizontal routing tracks or a multiple of the minimum poly pitch for the particular fabrication technology. In accordance with one embodiment, each standard cell in the standard cell library 116 has the same distance (or cell height) between two parallel supply voltage rails, as described in greater detail below in the context of FIG. 2. In practice, the standard cell library 116 may be stored on, encoded on, or otherwise embodied by any suitable non-transitory computer readable medium as computer-executable instructions or data stored thereon that may be accessed and/or executed by the placement tool 108 and/or computing device 120.

The routing tool 110 generally represents the software module executed or otherwise implemented by the computing device 120 that is configured to receive the placed standard cells from the placement tool 108 and implement one or more algorithms to optimally interconnect and/or route between the placed standard cells as specified by the design netlist while taking into account design rules for the fabrication technology to obtain a layout data file, such as a Graphical Database System II (or GDSII) format layout data file, that is representative of the placed and routed circuit described by the design netlist. In an exemplary embodiment, the routing tool 110 accesses a router technology file 118 that provides the design rules for the fabrication technology to be taken into account by the algorithms executed by the routing tool 110 to interconnect and/or route between the placed standard cells without violating the design rules. In practice, the router technology file 118 may be stored on, encoded on, or otherwise embodied by any suitable non-transitory computer readable medium as computer-executable instructions or data stored thereon that may be accessed and/or executed by the routing tool 110 and/or computing device 120. In this regard, although FIG. 1 depicts the router technology file 118 as a separate component of the electronic device design system 100, in some embodiments, the router technology file 118 may be a component of the routing tool 110 or otherwise implemented by and/or integrated with the routing tool 110.

In the illustrated embodiment, the analysis tool 112 generally represents the software module executed or otherwise implemented by the computing device 120 that is configured to obtain the completed layout data file from the routing tool 110, determine utilization metrics for the placed standard cells from the standard cell library 116, and display or otherwise graphically present the utilization metrics on the display device 114, as described in greater detail below. In an exemplary embodiment, the analysis tool 112 is configured to scan the completed layout obtained to identify each instance of a particular type of standard cell that was placed within the completed layout. As described in greater detail below, for each instance of that particular standard cell within the layout, the analysis tool 112 determines the locations on the input/output pins of that respective instance that were chosen or otherwise utilized by the routing tool 110 to connect to that respective instance of the standard cell (referred to herein as the routed connection locations). The analysis tool 112 correlates the routed connection locations (the connection locations that were chosen or otherwise utilized by the routing tool 110) for each respective input/output pin to a discrete connection location of a plurality of possible connection locations for that respective input/output pin, determines utilization metrics for the respective input/output pins of the standard cell based on the aggregate number of times each respective possible connection location for the respective input/output pin was utilized, and displays the utilization metrics on the display device 114, as described in greater detail below in the context of FIGS. 4-7.

Figure 2:
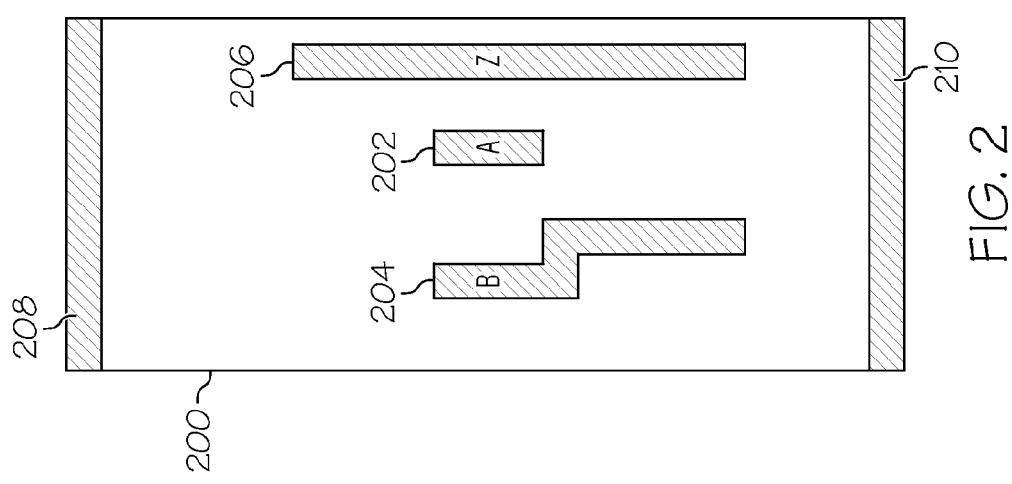
FIG. 2 is a top view of a pin layer of a standard cell suitable for use with the electronic device design system of FIG. 1 in an exemplary embodiment.

FIG. 2 depicts an exemplary embodiment of a standard cell 200 suitable for inclusion in the standard cell library 116 of FIG. 1. The illustrated embodiment of standard cell 200 represents a two-input logic gate, having a first connection area 202 corresponding to a first input of the logic gate, a second connection area 204 corresponding to a second input of the logic gate, and an output connection area 206 corresponding to the output of the logic gate. The connection areas 202, 204, 206 represent areas of a conductive material (e.g., metal, polysilicon, or the like) that are accessible to the routing tool 110 for contacting the inputs and outputs of the standard cell 200. In this manner, the connection areas 202, 204, 206 provide the input/output terminals (or pins) of the two-input logic gate, and for convenience, but without limitation, the connection areas 202, 204, 206 may alternatively be referred to herein as pins. It should be noted that FIG. 2 illustrates only the individual layer of the standard cell 200 that is accessible to the routing tool 110 (e.g., the uppermost layer of the standard cell 200), and that the transistors, resistors, capacitors, and/or other electrical components that are configured to implement the logical functionality of the two-input logic gate are implemented in underlying layers (e.g., beneath the pins 202, 204, 206) and electrically connected to the pins 202, 204, 206 in the appropriate manner. As shown, the layer including the pins 202, 204, 206 also includes a pair of connection areas 208, 210 configured to provide voltage rails for the standard cell 200 that are connected to a positive reference voltage (or supply voltage) and a negative reference voltage (or ground voltage), respectively. The voltage rails 208, 210 are parallel and separated by a distance (d) that corresponds to the standard dimension for the standard cell library 116. In this regard, each standard cell of the standard cell library 116 includes corresponding parallel voltage rails having the same distance (d) between them, such that each standard cell has the same height.

It should be understood FIG. 2 is simplified representation of a standard cell for purposes of explanation and ease of description, and FIG. 2 is not intended to limit the subject matter in any way. In this regard, although the subject matter is described herein in the context of a standard cell for a two-input logic gate, the subject matter is not limited to two-input logic gates, and may be utilized for standard cells having any number of input and/or output pins.

Figure 3:
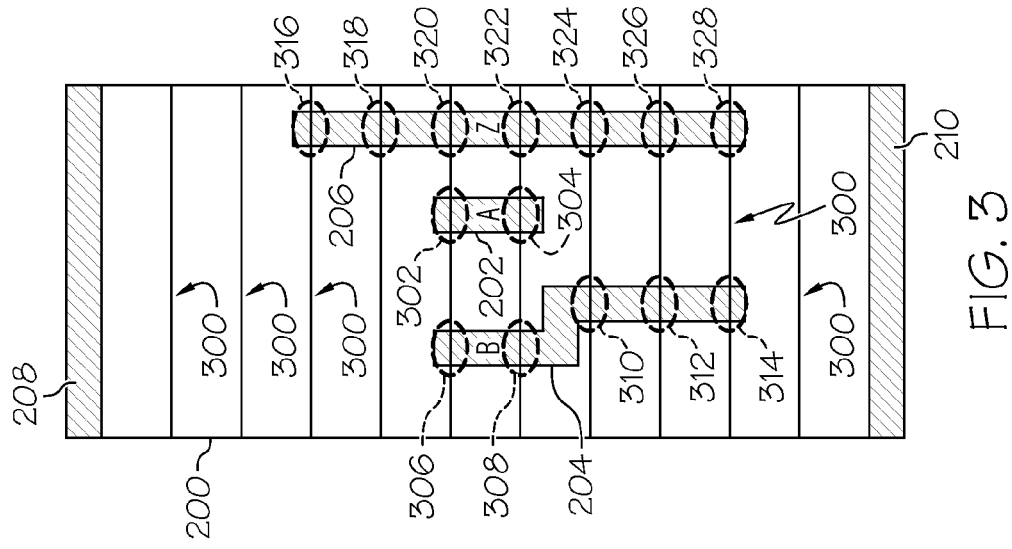
FIG. 3 is a top view of the pin layer of the standard cell of FIG. 2 illustrating possible connection locations for the pins of the standard cell in accordance with one embodiment.

Referring now to FIG. 3, as described in greater detail below, in an exemplary embodiment, the analysis tool 112 is configured to determine or otherwise identify a set of discrete possible connection locations for each pin connection area 202, 204, 206, for example, by subdividing each pin connection area 202, 204, 206 into a plurality of discrete segments, wherein each discrete segment represents a possible connection location. In accordance with one embodiment, the analysis tool 112 subdivides each pin connection area 202, 204, 206 into a plurality of possible pin connection locations based on constraints for the overlying layer being used by the routing tool 110 to route to/from the standard cell 200. In this regard, FIG. 3 illustrates an embodiment where the overlying metal layer is constrained to run horizontally (or parallel to the voltage rails 208, 210) and separated by a minimum metal-to-metal spacing distance for the fabrication technology. For each pin connection area 202, 204, 206, the analysis tool 112 may identify or otherwise determine possible pin connection locations as the locations where the respective pin connection area 202, 204, 206 and the overlying metal layer may intersect, that is, locations where the metal lines 300 of the overlying metal layer may potentially overlap and/or overlie the respective pin connection area 202, 204, 206. As illustrated in FIG. 3, the first input pin 202 has two possible pin connection locations 302, 304 where two of the metal lines 300 overlap and/or overlie its connection area 202, the second input pin 204 has five possible pin connection locations 306, 308, 310, 312, 314 where five of the metal lines 300 overlap and/or overlie its connection area 204, and the output pin 206 has seven possible pin connection locations 316, 318, 320, 322, 324, 326, 328 where seven of the metal lines 300 overlap and/or overlie its connection area 206. In accordance with one embodiment, the analysis tool 112 may be configured to eliminate or otherwise exclude possible pin connection locations when determining pin utilization metrics, as described in greater detail below. In this regard, based on design rules, portions of a pin connection area may not be capable of being utilized by the routing tool. For example, there may be a via or other component internal to the standard cell 200 that prevents the pin connection locations 316, 318 from being utilized by the routing tool 110 without violating design rules (e.g., minimum via spacing rules), as described in greater detail below.

It should be understood that FIG. 3 is a simplified representation of the standard cell and an overlying metal layer for purposes of explanation and ease of description, and FIG. 3 is not intended to limit the subject matter in any way. In this regard, in alternative embodiments, instead of determining the possible pin connection locations based on the overlying metal layer (e.g., when the overlying metal layer is not constrained to run in a particular direction), the analysis tool 112 may identify possible pin connection locations by subdividing each pin connection area 202, 204, 206 into a plurality of equally sized segments. It will be appreciated that there are numerous possible ways to subdivide a pin connection area, and the subject matter is not intended to be limited to any particular manner for subdividing the pin connection areas to determine possible pin connection locations.

Figure 4:
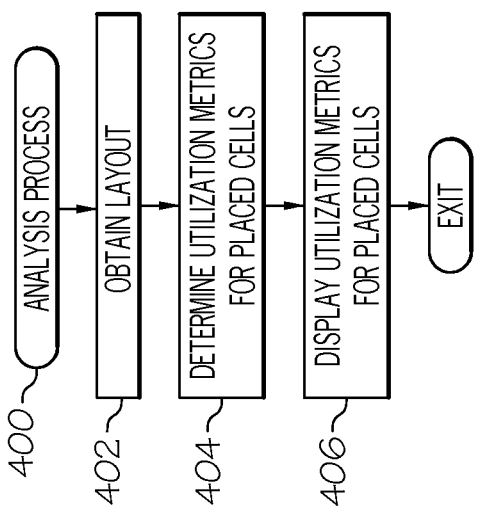
FIG. 4 is a flow diagram of an exemplary analysis process suitable for use with the electronic device design system of FIG. 1 in an exemplary embodiment.

Referring now to FIG. 4, in an exemplary embodiment, an electronic device design system 100 may be configured to perform an analysis process 400 and additional tasks, functions, and/or operations as described below. For illustrative purposes, the following description may refer to elements mentioned above in connection with FIGS. 1-3. In practice, the tasks, functions, and operations may be performed by different elements of the described system, such as the design tool 104, the synthesis tool 106, the placement tool 108, the routing tool 110, the analysis tool 112, the display device 114 and/or computing device 120. It should be appreciated any number of additional or alternative tasks may be included, and may be incorporated into a more comprehensive procedure or process having additional functionality not described in detail herein.

Referring to FIG. 4, and with continued reference to FIGS. 1-3, the analysis process 400 initializes or otherwise begins by obtaining a completed layout to be used in analyzing the pin utilization for one or more cells of a cell library (task 402). In this regard, the analysis tool 112 obtains a layout data file that was generated by the design tool 104, the synthesis tool 106, the placement tool 108, and the routing tool 110, as described above in the context of FIG. 1. In an exemplary embodiment, the layout data file corresponds to a test circuit design created by a user that is intended to test one or more aspects of the EDA tools implemented by the electronic device design system 100, such as, for example, the functionality of the placement tool 108, the functionality of the routing tool 110, a particular number of standard cells in the standard cell library 116, the ability of the routing tool 110 to access and/or connect to individual input/output pins of a particular standard cell in the standard cell library, and the like.

After obtaining the completed layout, the analysis process 400 continues by determining pin utilization metrics for a particular type of cell placed within the obtained layout (task 404). In an exemplary embodiment, the analysis process 400 determines pin utilization metrics for each different type of cell placed within the obtained layout. For example, if the layout includes a plurality of two-input NAND logic gates and a plurality of two-input OR logic gates, the analysis process 400 determines a first set of pin utilization metrics for the two-input NAND logic gate standard cell and a second set of pin utilization metrics for the two-input OR logic gate standard cell. It should be appreciated that some standard cell libraries may include multiple types of a particular logic gate (for example, standard cells for two-input NAND logic gates that have different drive strengths), and in such embodiments, the analysis process 400 differentiates between the types of the same functional logic gate, such that to determines pin utilization metrics for each different drive strength variation for each type of cell placed within the obtained layout (e.g., separate pin utilization metrics for a lower drive strength two-input NAND gate and a higher drive strength two-input NAND gate). As described in greater detail below in the context of FIG. 5, the analysis tool 112 may implement, execute, or otherwise perform a utilization process for each type of standard cell of the standard cell library 116 that was placed by the placement tool 108 into the layout in order to determine one or more utilization metrics for each pin of that respective type of standard cell. In this regard, the utilization metric(s) for each pin indicates or otherwise represents numerically the manner in which the routing tool 110 utilized its respective connection area.

In an exemplary embodiment, after determining utilization metrics for each type of cell placed in the layout, the analysis process 400 continues by displaying the utilization metrics for the placed cells on a display device (task 406). In this regard, the analysis tool 112 and/or computing device 120 are configured to display, on the display device 114, a graphical representation of the pin utilization metrics for each placed standard cell of the standard cell library 116 and graphically indicates the association between the pin utilization metrics and the respective type of standard cell or the respective pins of the respective type of standard cell, as described in greater detail below in the context of FIGS. 6-7. Thus, a user may view and analyze the displayed pin utilization metrics for each type of standard cell from the standard cell library 116 placed within the layout, and determine whether there may be any issues regarding the accessibility of any input/output pins of any of the types of standard cells based on the displayed pin utilization metrics. For example, if the pin utilization metrics indicate an unbalanced use of a particular pin connection area of a particular type of standard cell by the routing tool 110, there could be latent accessibility issues relating to that particular pin that may result in a failure to route to/from instances of that type of standard cell in a subsequent circuit design. Thus, in response to identifying an unbalanced use of a particular pin connection area of a particular type of standard cell by the routing tool 110, a user may determine that that particular standard cell needs to be redesigned (e.g., by repositioning, resizing, or otherwise redesigning the pin connection area(s) of that standard cell) to provide more balanced usage of the pin connection areas of that standard cell by the routing tool 110. Alternatively, the user may determine that there is an issue with the router technology file 118 and/or routing tool 110, and that the router technology file 118 and/or routing tool 110 may need to be modified to provide more balanced usage of the pin connection areas.

Figure 5:
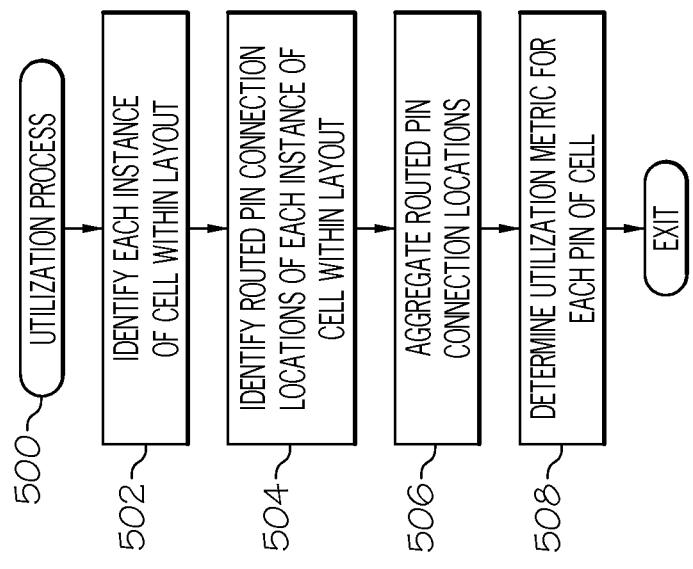
FIG. 5 is a flow diagram of an exemplary utilization process suitable for use with the analysis process of FIG. 4 in an exemplary embodiment.

Referring now to FIG. 5, in an exemplary embodiment, an electronic device design system 100 may be configured to perform a utilization process 500 and additional tasks, functions, and/or operations as described below. For illustrative purposes, the following description may refer to elements mentioned above in connection with FIGS. 1-4. In practice, the tasks, functions, and operations may be performed by different elements of the described system, such as the analysis tool 112, the display device 114 and/or computing device 120. It should be appreciated any number of additional or alternative tasks may be included, and may be incorporated into a more comprehensive procedure or process having additional functionality not described in detail herein.

As described above, in an exemplary embodiment, the utilization process 500 is performed to determine pin utilization metrics for each different type of cell placed within a layout. In this regard, the utilization process 500 begins by identifying, within the layout, each instance of the particular type of cell being analyzed (task 502). For example, the analysis tool 112 may scan the completed layout obtained from the routing tool 110 for each instance of the two-input logic gate standard cell 200 from the standard cell library 116 that was placed by the placement tool 108 into the layout. For each identified instance of the cell being analyzed, the utilization process 500 determines or otherwise identifies the routed pin connection locations for each input/output pin of that instance of the cell (task 504). As set forth above, the routed pin connection location for a respective pin of a cell should be understood as referring to the location that was utilized by the routing tool 110 to provide an electrical connection to or otherwise interface with that respective pin (e.g., the location where the routing tool 110 created a via between that pin and the overlying metal layer). For example, for each instance of the two-input logic gate standard cell 200 identified in the layout, the analysis tool 112 may determine a routed pin connection location for the first input pin 202 by determining two-dimensional coordinates of the location of the electrical connection created by the routing tool 110 between the overlying metal layer and the first input pin connection area 202 relative to the origin of the standard cell 200. In a similar manner, the analysis tool 112 may determine a routed pin connection location for the second input pin 204 by determining two-dimensional coordinates for the location of the electrical connection created by the routing tool 110 between the overlying metal layer and the second input pin connection area 204, and the analysis tool 112 may determine a routed pin connection location for the output pin 206 by determining two-dimensional coordinates for the location of the electrical connection created by the routing tool 110 between the overlying metal layer and the output pin connection area 206.

In an exemplary embodiment, the utilization process 500 continues by aggregating the routed pin connection locations for all of the instances of the cell being analyzed and determining a pin utilization metric for each possible pin connection location of each pin (tasks 506, 508). In this regard, analysis tool 112 obtains a plurality of routed pin connection locations for each pin of the two-input logic gate standard cell 200. In an exemplary embodiment, the analysis tool 112 determines pin utilization metrics for each pin based on the relative distribution of the routed pin connection locations for that pin across the possible pin connection locations for that pin. In accordance with one or more embodiments, the analysis tool 112 keeps track of the number of time each possible pin connection location was utilized by the routing tool 110 by counting or otherwise adding the routed pin connection locations for each instance of the cell until all of the cells have been accounted for. For example, the analysis tool 112 may count all the routed pin connection locations corresponding to pin connection location 302 to determine a first pin utilization metric corresponding to the total number of times that pin connection location 302 was utilized by the routing tool 110, and count all the routed pin connection locations corresponding to pin connection location 304 to determine a second pin utilization metric corresponding to the total number of times that pin connection location 304 was utilized by the routing tool 110. In yet other embodiments, the analysis tool 112 may determine a pin utilization metric for pin connection location 302 corresponding to the relative frequency or percentage of times that the routing tool 110 utilized pin connection location 302, for example, by taking a ratio of the total number of times that pin connection location 302 was utilized by the routing tool 110 to the total number of times that the two-input logic gate standard cell 200 was placed and/or utilized in the layout. In a similar manner, the analysis tool 112 may determine pin utilization metrics for the remaining possible pin connection locations 306, 308, 310, 312, 314, 316, 318, 320, 322, 324, 326, 328.

Figure 6:
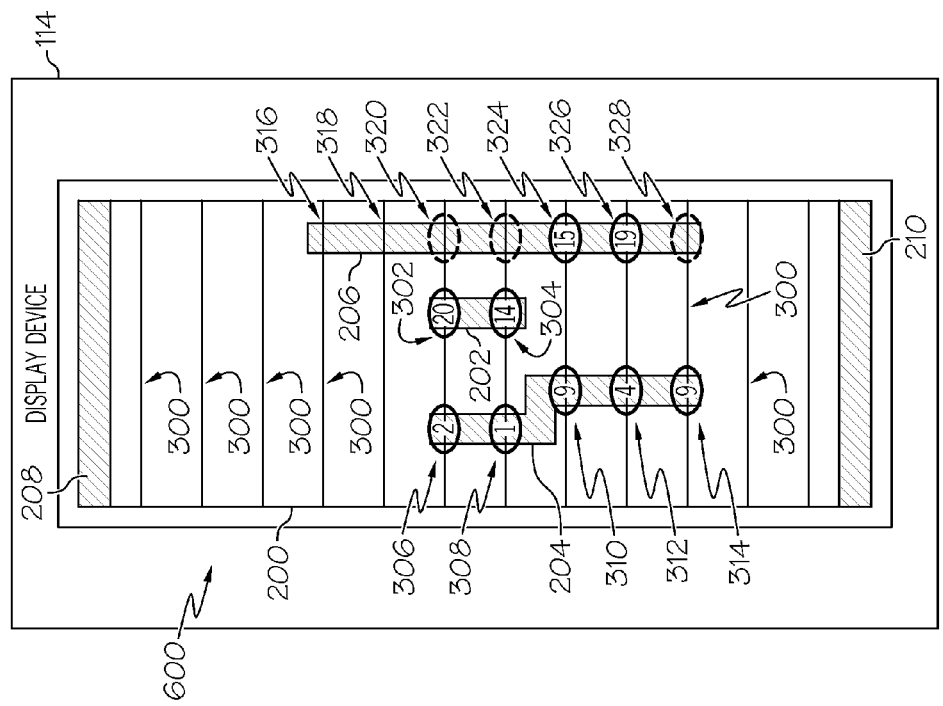
FIG. 6 is a schematic view of a graphical representation of the standard cell of FIG. 2 and corresponding utilization metrics displayed on the display device of FIG. 1 suitable for use with the analysis process of FIG. 4 in accordance with one embodiment.

Referring now to FIG. 6, and with continued reference to FIGS. 1-5, as set forth above in the context of FIG. 4, after determining pin utilization metrics, the analysis process 400 displays, on the display device 114, a graphical representation of the pin utilization metrics for each different type of cell of the standard cell library 116 that was placed in the layout. In this regard, after performing the utilization process 500 to identify each instance of two-input logic gate standard cell 200 in the layout, aggregate the routed pin connection locations across all the instances of the two-input logic gate standard cell 200, and determine pin utilization metrics for the pin connection locations of the two-input logic gate standard cell 200, the analysis tool 112 and/or analysis process 400 may display the determined pin utilization metrics on the display device 114 in association with their respective pin connection locations. For example, as illustrated in FIG. 6, the analysis tool 112 and/or analysis process 400 may display a graphical representation 600 of the standard cell 200 on the display device 114 that includes graphical representations of the pin connection areas 202, 204, 206. As illustrated in FIG. 6, in an exemplary embodiment, the analysis process 400 and/or analysis tool 112 graphically indicates the possible pin connection locations for the pins 202, 204, 206 of the standard cell 200, for example, by displaying a graphical representation of vias overlying the possible pin connection locations, or graphically circling or displaying other suitable indicia to indicate or otherwise delineate the possible pin connection locations. In accordance with one embodiment, the analysis process 400 and/or analysis tool 112 may graphically indicate the unused possible pin connection locations 320, 322, 328, for example, by displaying or rendering the graphical representations of vias overlying the unused possible pin connection locations 320, 322, 328 using a visually distinguishable characteristic (e.g., a visually distinguishable line type, color, texture, pattern, or the like) to allow a user to more readily identify unused possible pin connection locations 320, 322, 328.

In an exemplary embodiment, the analysis process 400 and/or analysis tool 112 graphically indicates the association between the pin utilization metrics and the possible pin connection locations by displaying graphical representations of the pin utilization metrics overlying the graphical representations of the pin connection areas 202, 204, 206 at locations corresponding to their associated possible pin connection location. As illustrated in FIG. 6, in an exemplary case, the routing tool 110 utilized pin connection location 302 of the first input pin connection area 202 twenty times (or approximately fifty-nine percent of the time) and utilized pin connection location 304 of the first input pin connection area 202 fourteen times (or approximately forty-one percent of the time), indicating a relatively balanced utilization of the first input pin connection area 202. The routing tool 110 utilized each pin connection location 306, 308, 310, 312, 314 of the second input pin connection area 204 at least once, but utilized pin connection location 314 over fifty percent of the time and more than twice the next most utilized pin connection location 310, indicating a less balanced utilization of the second input pin connection area 204. The routing tool 110 failed to utilize each pin connection location 316, 318, 320, 322, 324, 326, 328, and in fact, used only two connection locations 324, 326 of the possible pin connection locations, indicating a relatively unbalanced utilization of the output pin connection area 206 by the routing tool 110. Accordingly, a user may attempt to rationalize the behavior of the routing tool 110 with respect to the second input pin connection area 204 and/or output pin connection area 206 (for example, the unbalanced utilization may be attributable to design rules or other constraints), and if the user believes the unbalanced utilization of the second input pin 204 and/or output pin 206 is attributable to the layout and/or design of the standard cell 200, the user may redesign the standard cell 200 to reposition, resize, or otherwise rearrange the second input pin connection area 204 and/or output pin connection area 206 within the standard cell 200 to achieve more balanced utilization of the second input pin connection area 204 and/or output pin connection area 206. As described above, in some embodiments, the analysis process 400 and/or analysis tool 112 may graphically indicate that locations 316, 318 are actually not possible pin connection locations (e.g., due to design rules or constraints based on the other components of the standard cell 200) by failing to display indicia that would otherwise indicate or otherwise delineate locations 316, 318 as being possible pin connection locations.

Figure 7:
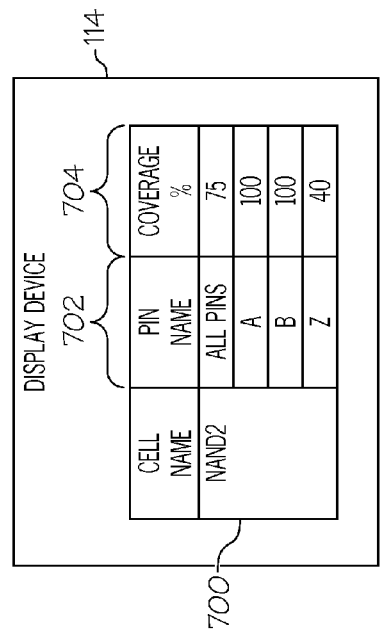
FIG. 7 is a schematic view of a graphical representation of utilization metrics corresponding to the standard cell of FIG. 2 displayed on the display device of FIG. 1 in accordance with another embodiment.

Referring now to FIG. 7, and with continued reference to FIGS. 1-6, in accordance with one or more embodiments, in lieu of or in addition to displaying a graphical representation of a cell with overlying pin utilization metrics, the analysis process 400 and/or analysis tool 112 may display a table 700 on the display device 114 that graphically represents the utilization metrics for one or more standard cells of the standard cell library 116. In the illustrated embodiment, the table 700 includes a first column 702 having entries corresponding to the individual input/output pins of the standard cell and a second column 704 having entries corresponding to pin utilization metrics for the respective input/output pins listed in the first column 702, wherein a respective pin utilization metric and its corresponding input/output pin are aligned in the same row of the table 700 to graphically indicate their association.

In an exemplary embodiment, the second column 704 includes pin utilization metrics that indicate the percentage of the possible pin connection locations for each respective pin that were utilized by the routing tool 110. For example, in the exemplary case described above in the context of FIG. 6, the routing tool 110 utilized both pin connection locations 302, 304 of the first input pin connection area 202, resulting in an overall pin utilization metric for the first input pin connection area 202 of one hundred percent. Similarly, the routing tool 110 utilized each pin connection location 306, 308, 310, 312, 314 of the second input pin connection area 204 at least once. However, as described above, the routing tool 110 only utilized two of the five possible pin connection locations 320, 322, 324, 326, 328 for the output pin area 206, resulting in an overall pin utilization metric for the output pin connection area 206 of forty percent. In the illustrated embodiment of FIG. 7, the table 700 includes a cumulative pin entry in the first column 702 that represents all of the pins of the standard cell 200, and a cumulative pin utilization metric in the second column 704 that represents the percentage of the total possible pin connection locations of the standard cell 200 that were utilized by the routing tool 110. In this regard, for the exemplary case described above, the routing tool 110 utilized nine of the twelve possible pin connection locations for the standard cell 200, and thus, the table 700 indicates a cumulative pin utilization metric of seventy-five percent for standard cell 200. As described above, after viewing and analyzing the table 700, a user may redesign the standard cell 200 to reposition, resize, or otherwise rearrange the output pin connection area 206 to achieve greater utilization of the output pin connection area 206 if the user believes the relatively low utilization of the output pin connection area 206 is attributable to the layout and/or design of the standard cell 200.

It should be appreciated that FIG. 7 is a simplified representation of a table for purposes of explanation, and FIG. 7 is not intended to limit the subject matter in any way. For example, in some embodiments, the analysis process 400 and/or analysis tool 112 may display a table that displays pin utilization metrics for multiple standard cells of the standard cell library 116. Furthermore, in some embodiments, the table displayed by the analysis process 400 and/or analysis tool 112 may display entries for each possible connection location for each input/output pin of each standard cell of the standard cell library 116, wherein the pin utilization metric based on the number of times that respective possible connection location was utilized by the routing tool 110 (e.g., the number of identified routed connection locations corresponding to that respective possible connection location or the percentage that the routing tool 110 utilized the respective possible connection location of the pin) is displayed in association with each respective possible connection location.

To briefly summarize, one advantage of the methods described herein is that the pin utilization metrics for the input/output pins of standard cells of a standard cell library may be determined and presented to a user in a manner that allows the user to analyze the utilization of the pin connection areas for the input/output pins and identify any pin connection areas that may result in subsequent routing failures. As described above, when the pin utilization metrics indicate that a pin connection area is underutilized or used in an unbalanced manner, a user may redesign the pin connection areas of the standard cell and/or modify the routing tool and/or router technology file to achieve more balanced utilization of the pin connection areas of the standard cell by the routing tool to reduce the likelihood of routing failures in subsequent designs.

For the sake of brevity, conventional techniques related to integrated circuit design, EDA design flows, and other functional aspects of the systems (and the individual operating components of the systems) may not be described in detail herein. Physical embodiments of the subject matter described herein can be realized using existing semiconductor fabrication techniques and computer-implemented design tools. For example, embodiments of the subject matter described herein can be stored on, encoded on, or otherwise embodied by any suitable non-transitory computer-readable medium as computer-executable instructions or data stored thereon that, when executed by a computer, processor, of the like, facilitate design of electronic circuits using standard cell libraries and analysis of the standard cells utilized in the completed layout of the electronic circuit.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of analyzing a cell of a cell library used to generate a layout, the method comprising:
   determining, for each instance of the cell in the layout, a respective routed connection location utilized in the layout for a pin of the cell, resulting in a plurality of routed connection locations; and
   determining a utilization metric for the pin of the cell based on the plurality of routed connection locations and a plurality of possible connection locations for the pin; and
   displaying the utilization metric on a display device, wherein the utilization metric enables a user to identify issues of the types of standard cells regarding accessibility of the pin of the cell in the layout based on the displayed utilization metric.

2. The method of claim 1, wherein displaying the utilization metric comprises:
   displaying, on the display device, a graphical representation of the cell, the graphical representation of the cell including a graphical representation of a pin coverage area for the pin; and
   displaying the utilization metric overlying the pin coverage area.

3. The method of claim 1, wherein displaying the utilization metric comprises graphically indicating an association between the utilization metric and the pin of the cell.

4. The method of claim 1, wherein displaying the utilization metric comprises displaying a table indicating an association between the utilization metric and the pin of the cell.

5. The method of claim 1, wherein determining the utilization metric comprises:
   identifying, for each instance of the cell in the layout, a possible connection location of the plurality of possible connection locations for the pin corresponding to the respective routed connection location;
   determining, for each possible connection location of the plurality of possible connection locations, a number of times that respective possible connection location is utilized in the layout based on the possible connection location identified for each instance of the cell in the layout; and
   determining the utilization metric for the pin of the cell based on the number of times each possible connection location of the plurality of possible connection locations for the pin is utilized in the layout.

6. The method of claim 1, wherein determining the utilization metric comprises determining a percentage of the plurality of possible connection locations that are utilized in the layout.

7. The method of claim 1, wherein determining the utilization metric comprises determining, for each possible connection location of the plurality of possible connection locations, a number of times that respective possible connection location is utilized in the layout based on a number of routed connection locations of the plurality of routed connection locations that correspond to that respective possible connection location.

8. The method of claim 7, further comprising:
   displaying, on a display device, a graphical representation of the cell including a graphical representation of a pin coverage area for the pin; and
   for each possible connection location, displaying the number of times that respective possible connection location is utilized in the layout overlying a location on the graphical representation of the pin coverage area corresponding to that respective possible connection location.

9. The method of claim 7, wherein determining the utilization metric further comprises determining, for each possible connection location of the plurality of possible connection locations, a utilization percentage based on the number of times that respective possible connection location is utilized in the layout and a number of instances of the cell in the layout.

10. The method of claim 9, further comprising:
    displaying, on a display device, a graphical representation of the cell including a graphical representation of a pin coverage area for the pin; and
    for each possible connection location, displaying the utilization percentage overlying a location on the graphical representation of the pin coverage area corresponding to that respective possible connection location.

11. A method of analyzing a cell of a cell library used to obtain a layout, the method comprising:
    identifying each instance of the cell placed in the layout, resulting in a plurality of placed cells;
    identifying, for each placed cell of the plurality of placed cells, a routed connection location utilized by the layout to connect to a first terminal of the cell, resulting in a plurality of routed connection locations;
    determining, for each possible connection location of a plurality of possible connection locations for the first terminal of the cell, a number of times that respective possible connection location is utilized in the layout based on a number of routed connection locations of the plurality of routed connection locations that correspond to that respective possible connection location;
    determining a utilization metric for the cell based on the number of times that each respective possible connection location is utilized in the layout; and
    displaying the utilization metric on a display device, wherein the utilization metric enables a user to identify issues of the types of standard cells regarding accessibility of the pin of the cell in the layout based on the displayed utilization metric.

12. The method of claim 11, wherein:
    determining the utilization metric comprises determining, for each possible connection location, a connection location utilization metric; and
    displaying the utilization metric comprises:
       displaying a graphical representation of the first terminal; and
       displaying a graphical representation of the connection location utilization metric for each possible connection location overlying a location on the graphical representation of the first terminal corresponding to the respective possible connection location.

13. The method of claim 11, wherein:
    determining the utilization metric comprises determining an overall utilization metric for the first terminal based on a number of different routed connection locations of the plurality of routed connection locations and a total number of possible connection locations for the first terminal; and displaying the utilization metric comprises graphically indicating an association between the overall utilization metric and the first terminal of the cell.

14. The method of claim 11, wherein:
identifying the routed connection location for each placed cell of the plurality of placed cells comprises determining, for each placed cell of the plurality of placed cells, a coordinate location for a connection to the first terminal of the cell; and
determining the number of times that each respective possible connection location is utilized in the layout comprises determining a number of placed cells of the plurality of placed cells having the coordinate location for the connection to the first terminal corresponding to a respective coordinate location for that respective possible connection location.

15. The method of claim 11, further comprising:
identifying, for each placed cell of the plurality of placed cells, a second routed connection location utilized by the layout to connect to a second terminal of the cell, resulting in a second plurality of routed connection locations;
determining, for each possible second terminal connection location of a plurality of possible second terminal connection locations for the second terminal of the cell, a number of times that respective possible second terminal connection location is utilized in the layout based on a number of routed connection locations of the second plurality of routed connection locations that correspond to that respective possible second terminal connection location;
determining a second utilization metric for the cell based on the number of times that each respective possible second terminal connection location is utilized in the layout; and
displaying the second utilization metric on the display device.

16. A computer-readable medium having computer-executable instructions or data stored thereon executable by a computing device to:
obtain a layout representative of a netlist, the layout utilizing a cell library to implement the netlist;
identify each instance of a first cell of the cell library placed in the layout;
determine a utilization metric for the first cell based on routed connection locations for a pin of the first cell utilized in the layout for the identified instances of the first cell; and
display a graphical representation of the utilization metric on a display device communicatively coupled to the computing device, wherein the utilization metric enables a user to identify issues of the types of standard cells regarding accessibility of the pin of the cell in the layout based on the displayed utilization metric.

17. The computer-readable medium of claim 16, wherein the computer-executable instructions or data stored thereon are executable by the computing device to determine, for each identified instance of the first cell in the layout, a respective routed connection location utilized in the layout to connect to the pin of the respective instance of the first cell, resulting in the plurality of routed connection locations.

18. The computer-readable medium of claim 17, wherein the computer-executable instructions or data stored thereon are executable by the computing device to determine the utilization metric based on the plurality of routed connection locations and a plurality of possible connection locations for the pin.

19. The computer-readable medium of claim 18, wherein the computer-executable instructions or data stored thereon are executable by the computing device to:
identify, for each instance of the cell in the layout, a possible connection location of the plurality of possible connection locations for the pin corresponding to the respective routed connection location;
determine, for each possible connection location of the plurality of possible connection locations, a number of times that respective possible connection location is utilized in the layout based on the possible connection location identified for each instance of the cell in the layout; and
determine the utilization metric for the pin of the cell based on the number of times each possible connection location of the plurality of possible connection locations for the pin is utilized in the layout.

20. The computer-readable medium of claim 16, wherein the computer-executable instructions or data stored thereon are executable by the computing device to display a graphical representation of the first cell on the display device, the graphical representation of the utilization metric being displayed overlying the graphical representation of the first cell.

* * * * *